United States Patent [19]
Ozaki

[11] Patent Number: 5,282,166
[45] Date of Patent: Jan. 25, 1994

[54] SERIAL ACCESS MEMORY COMPRISING DISCONNECTING CIRCUIT BETWEEN SERIAL BUS LINES AND PREAMPLIFIER

[75] Inventor: Atsushi Ozaki, Hyogo, Japan

[73] Assignee: Mitsubishi Denki Kabushiki Kaisha, Tokyo, Japan

[21] Appl. No.: 825,214

[22] Filed: Jan. 24, 1992

[30] Foreign Application Priority Data

Jun. 12, 1991 [JP] Japan ................................ 3-140136

[51] Int. Cl.⁵ ................................................ G11C 7/00
[52] U.S. Cl. ........................................ 365/203; 365/208
[58] Field of Search ............ 365/203, 208, 207, 189.11, 365/230.08

[56] References Cited

U.S. PATENT DOCUMENTS

| | | | |
|---|---|---|---|
| 4,888,737 | 12/1989 | Sato | 365/203 |
| 4,926,387 | 5/1990 | Madland | 365/203 |
| 4,943,944 | 7/1990 | Sakui | 365/203 |
| 4,984,204 | 1/1991 | Sato | 365/189.11 |
| 5,068,831 | 11/1991 | Hoshi | 365/203 |
| 5,153,459 | 10/1992 | Park | 365/203 |

Primary Examiner—Joseph A. Popek
Assistant Examiner—A. Zarabian
Attorney, Agent, or Firm—Lowe, Price, LeBlanc & Becker

[57] ABSTRACT

An improved serial access memory without erroneous reading where a faster reading operation is required. The serial access memory includes a disconnecting circuit connected between a serial bus line pair and a preamplifier. A data signal read out from a memory cell is provided to the preamplifier via the serial bus line pair. The disconnecting circuit electrically disconnects the serial bus line pair from the preamplifier after a predetermined time has elapsed since the preamplifier commences amplifying operation. An equalize circuit commences equalization of a next data signal right after the operation of the disconnecting circuit. Since the equalize timing of the serial bus line pair for reading the next data is made to commence earlier, proper reading operation can be realized even if the frequency of an externally applied serial out clock signal SOC is increased.

12 Claims, 11 Drawing Sheets

SERIAL ACCESS MEMORY COMPRISING DISCONNECTING CIRCUIT BETWEEN SERIAL BUS LINES AND PREAMPLIFIER

BACKGROUND OF THE INVENTION

1. Field of the Invention

The present invention generally relates to semiconductor memory devices, and more particularly to an improvement of the equalize timing of a signal transmission line for transmitting a data signal provided from a bit line. This invention has particular applicability to a serial access memory.

2. Description of the Background Art

The recent usage of semiconductor memories in various equipments have led to the need of various features. In addition to the basic features of a semiconductor memory to store an applied (or a predetermined) data and read out the stored data, the feature for access has also become necessary. Particularly, serial access, i.e. serial reading and/or serial writing of data signals, has become necessary to process video signals or image signals at a high speed.

A field memory and a video RAM, for examples, are known as random access memories (RAM) having serial access feature. In a field memory, an applied data signal is written in series into a memory cell, and the stored data signal is read out in the order that it was written. A field memory is often used as a delay circuit for video signal processing since it has a memory capacity that can store digital pixel signals of one screen of a television, for example.

A video RAM comprises a random access port and a serial access port. Through a random access port, an applied data signal is stored in an externally specified memory cell, and the stored data signal is read out from an externally specified memory cell. Through a serial access port, an applied data signal is stored in an externally specified memory cell row in series, and the stored data signal is read out in series from an externally specified memory cell row. The random access port is frequently used to carry out the image signal processing at a high speed. The serial access port is used to supply the processed signal, i.e. the stored image signal, to an image display device such as a CRT at a high speed.

A first-in-first-out (FIFO) memory, though not a RAM, is also known, for storing applied data signals in series and reading out in series the stored data signal in the order that they were stored.

It is appreciated that the above semiconductor memories are common in the point that they have a feature for reading out in series the data signal stored in a memory cell. Although the present invention is applicable to a semiconductor memory, particularly to a serial access memory having serial access feature, a field memory will be taken as an example in the following to simplify the description.

A field memory is widely used for the purpose of processing video signals and image signals in television technology and video tape recorders (VTRs). A video signal is converted into a digital signal by an A/D converter to be stored temporarily within a serial access memory. Various image processing is carried out to the stored video signals to realize the features of noise reduction and interlace display in image display. This processing gives rise to the need of image processing in a higher speed using field memory. Accordingly, there is a strong demand for improvement in the operation speed of serial access memory. For example, a time period of less than 30 ns is required as the cycle time of a serial out clock signal used for reading in series stored data. Some recently developed field memories have a cycle time as low as 10 ns. The trend in increasing operation speed in serial access memories is expected to grow as the request for high speed operation of image processing becomes great.

Figure 4:
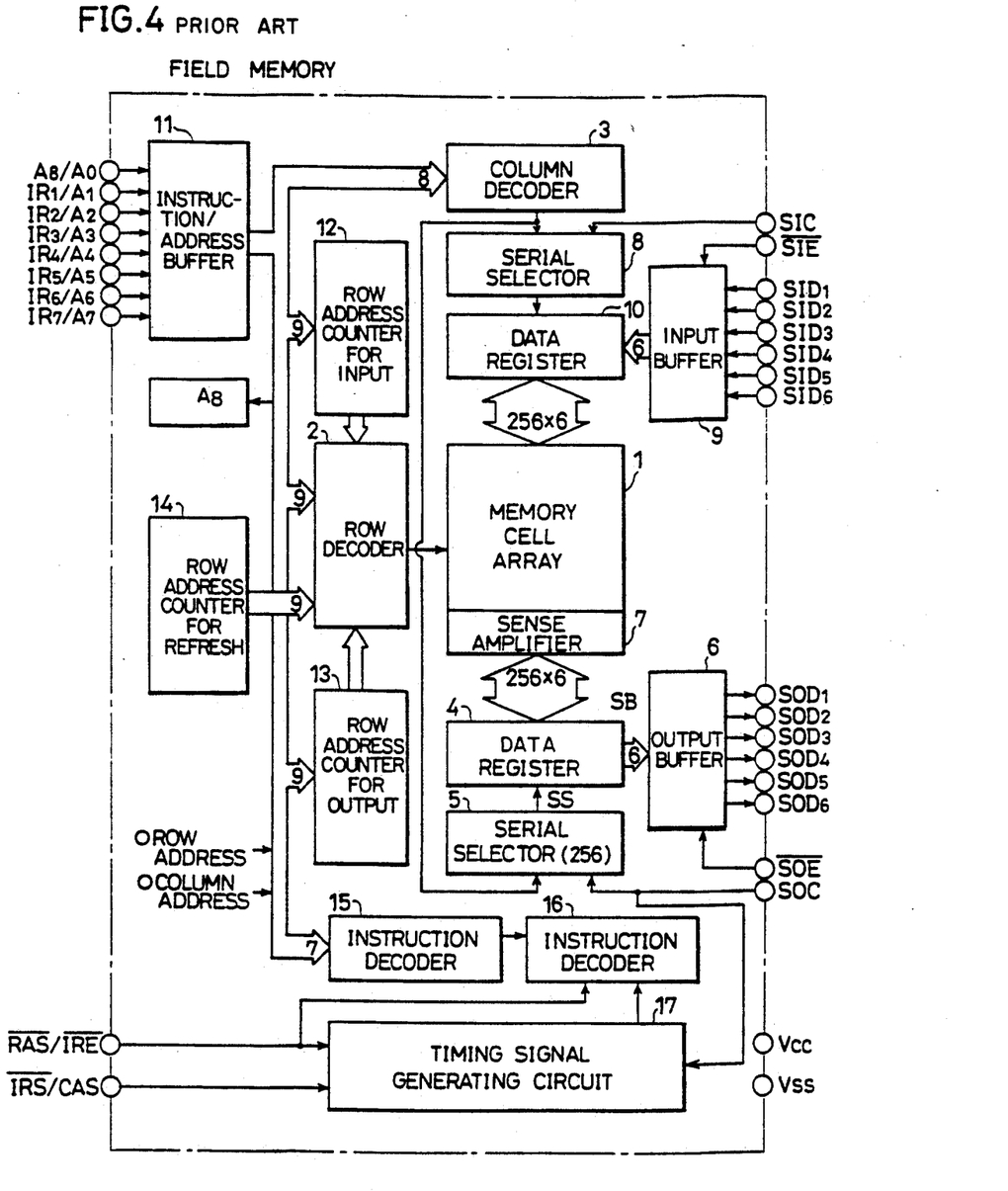
FIG. 4 is a block diagram of a field memory showing the background of the present invention.

FIG. 4 is a block diagram of a field memory showing the background of the present invention. Referring to FIG. 4, this field memory comprises a memory cell array 1 having a plurality of memory cells arranged in rows and columns, a row decoder 2 for selecting an externally specified memory cell row, a column decoder 3 for selecting an externally specified memory cell column, and a sense amplifier 7 for amplifying a data signal read out from a memory cell. A serial selector 8 for data input is connected to column decoder 3.

In writing operation, input buffer 9 receives externally applied serial input data SID1-SID6 to provide the same to a data register 10. Data register 10 holds the applied parallel data to provide the same to memory cell array 1 in response to an output signal generated from serial selector 8. Row decoder 2 selects one word line specified by an externally applied address signal, whereby the data provided from data register 10 is written into one memory cell row.

In reading operation, row decoder 2 selects a word line specified by an externally applied address signal. The data signals stored in the memory cell row connected to the selected word line are applied to a bit line (not shown) and amplified by sense amplifier 7. The parallel data signals amplified by sense amplifier 7 are provided to a data register 4 to be held therein. Serial selector 5 responds to an externally applied serial output clock signal SOC to sequentially select a latch circuit provided in data register 4. In other words, data register 4 responds to a serial selecting signal SS generated from serial selector 5 to provide the held or latched data signal sequentially to a serial bus SB. An output buffer 6 is connected to data register 4 via serial bus SB. Therefore, the data signals read out from a memory cell row in memory cell array 1 are provided as serial output data SOD1-SOD6 via output buffer 6.

The other circuits in the field memory will be explained hereinafter briefly. An instruction/address buffer 11 receives externally applied instruction signals IR1-IR7/address signals A0-A8. The received address signals A0-A8 are applied to row decoder 2, column decoder 3, a row address counter 12 for input, and a row address counter 13 for output. Row decoder 2 responds to a count signal from address counter 12 or 13 to select a memory cell row, i.e., a word line. In refresh mode, row decoder 2 also responds to a count signal from a row address counter 14 for refresh to select a word line. An instruction signal received by instruction/address buffer 11 is held within an instruction register 15. An instruction decoder 16 receives an instruction signal held in instruction register 15 to decode the same. Instruction decoder 16 generates various control signals for the operation of the field memory according to the externally applied instruction. The field memory comprises a timing signal generating circuit 17 for generating a timing signal to operate the above circuits in synchronization.

Figure 5:
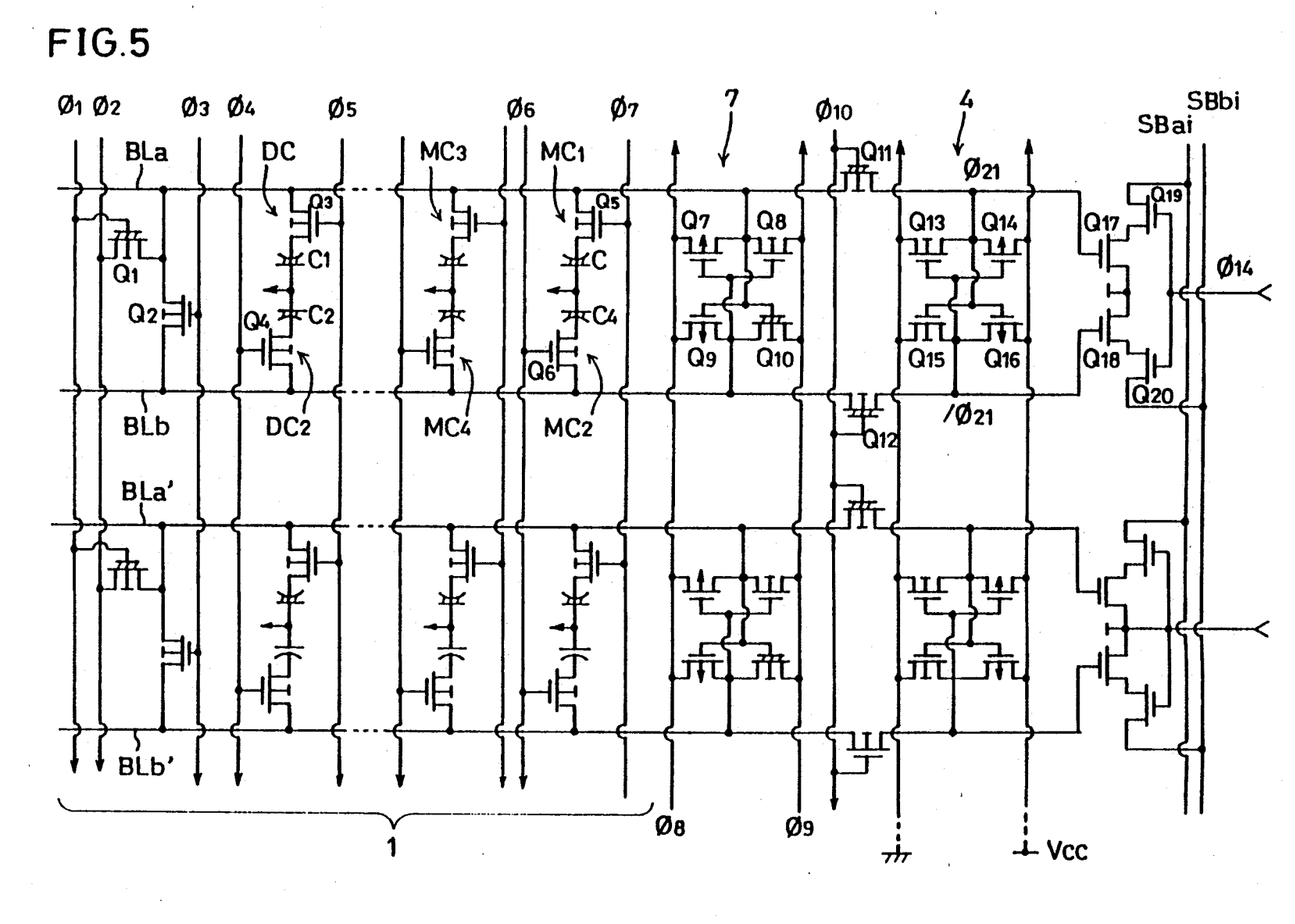
FIG. 5 is a circuit diagram of a memory cell array, a sense amplifier, and a data register of FIG. 4.

FIG. 5 is a circuit diagram of memory cell array 1, sense amplifier 7, and data register 4 of FIG. 4. Although FIG. 5 shows the circuits associated with two memory cell columns, only the circuits associated with one memory cell column will be explained to simplify the description. Referring to FIG. 5, a bit line BLa and a bit line BLb form a bit line pair to transmit data signals inverted with respect to each other. An NMOS transistor Q1 is operated in response to a bit line hold signal $\phi 1$ to hold the potentials of the bit line pair BLa, BLb at a predetermined potential (Vcc/2). In other words, bit line pair BLa, BLb is set to potential Vcc/2 when transistor Q1 is turned on, since signal $\phi 2$ always has a potential of Vcc/2. An NMOS transistor Q2 is connected between bit lines BLa and BLb to equalize the bit line pair BLa, BLb in response to an equalize signal $\phi 3$. Dummy memory cells DC1 and DC2 are connected to bit lines BLa and BLb, respectively. Switching transistors Q3 and Q4 are operated in response to dummy word line signals $\phi 5$ and $\phi 4$, respectively.

There are two memory cells MC1 and MC3 connected to bit line BLa, and two memory cells MC2 and MC4 connected to bit line BLb. For example, memory cell MC1 comprises an NMOS transistor Q5 for switching and a capacitor C3 for storing a data signal. Transistor Q5 operates in response to a word line signal $\phi 7$ provided from a row decoder (not shown). Switching transistor Q6 forming memory cell MC2 operates in response to another word line signal $\phi 6$.

A sense amplifier 7 is constituted by PMOS transistors Q7 and Q9, and NMOS transistors Q8 and Q10. A plurality of sense amplifiers provided along the row direction are activated in response to activation signals $\phi 8$ and $\phi 9$. NMOS transistors Q11 and Q12 are connected to the corresponding bit lines of BLa and BLb, respectively, to transmit a bit line signal to data register circuit 4 in response to a transfer signal $\phi 10$.

One latch circuit forming data register circuit 4 comprises NMOS transistors Q13 and Q15, and PMOS transistors Q14 and Q16. Each of the latch circuits provided along the row direction is connected between power supply potential Vcc and ground potential.

One serial transfer circuit formed by four NMOS transistors Q17–Q20 responds to a serial selecting signal $\phi 14$ generated from serial selector 5 shown in FIG. 4 to transfer data signals $\phi 21$ and $\overline{\phi 21}$ latched by the aforementioned one latch circuit to serial bus lines SBai and SBbi. In other words, one of transistors Q17 and Q18 is turned on in response to signal $\phi 21$ or signal $\overline{\phi 21}$. Also, transistors Q19 and Q20 are turned on in response to serial selecting signal $\phi 14$ to provide a data signal latched in the latch circuit to serial bus lines SBai and SBbi.

Figure 6:
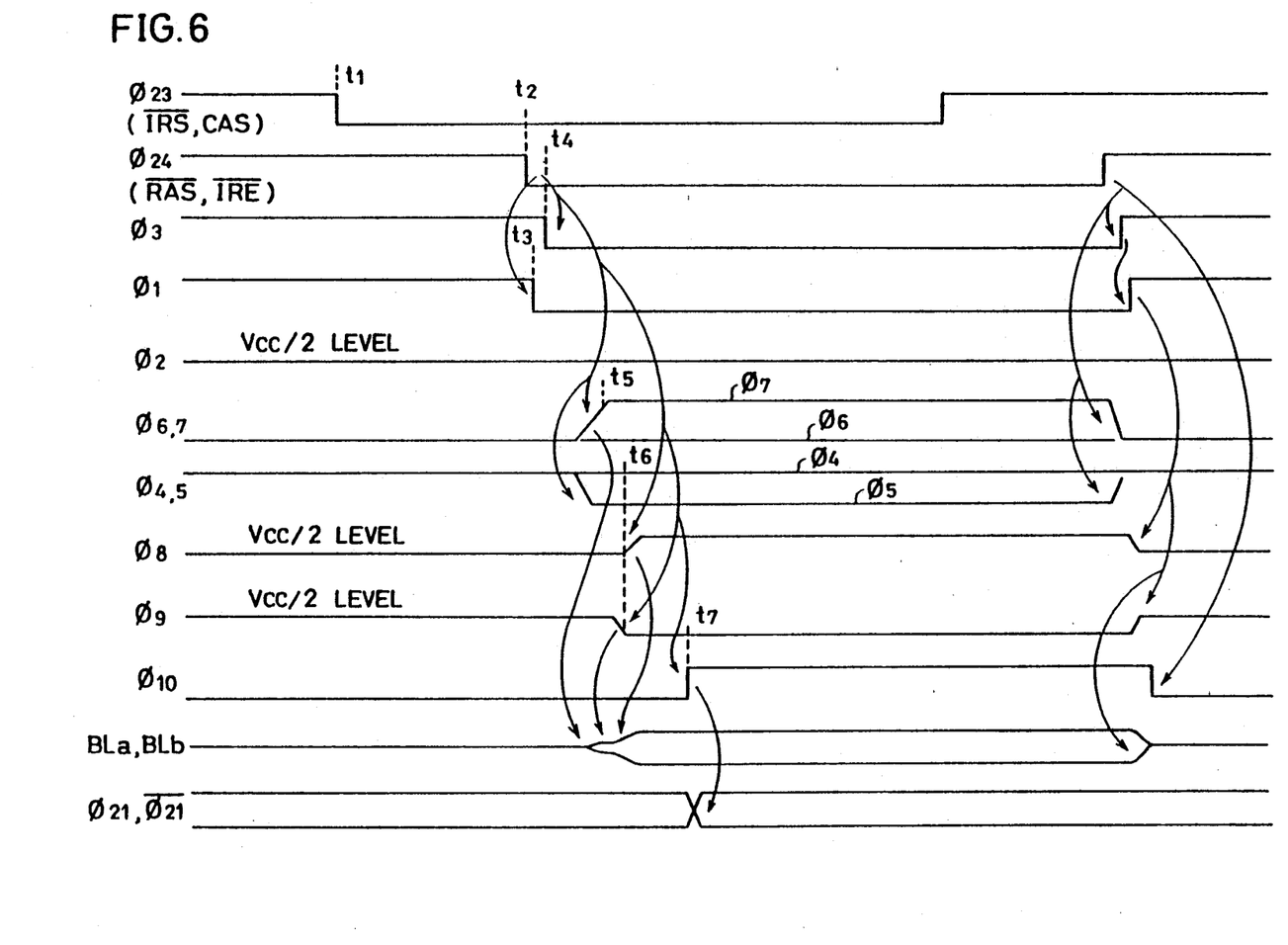
FIG. 6 is a timing chart for explaining the operation of the circuit of FIG. 5.

FIG. 6 is a timing chart for explaining the operation of the circuits of FIG. 5. Referring to FIGS. 5 and 6, the reading operation will be explained hereinafter. Signal $\overline{IRS}$ in FIG. 6 indicates an externally applied instruction strobe signal. Signal $\overline{CAS}$ indicates a column address strobe signal. Signal $\overline{RAS}$ indicates a row address strobe signal. Signal $\overline{IRE}$ indicates an instruction enable signal. These signals are applied from an external source, as shown in FIG. 4, to control the reading and writing operations of the field memory. In the following description, signals $\overline{IRS}$ and $\overline{CAS}$ are represented by signal $\phi 23$, and signals $\overline{RAS}$ and $\overline{IRE}$ are represented by signal $\phi 24$.

Following the fall of signal $\phi 23$ at time t1, signal $\phi 24$ also falls at time t2. Signals $\phi 1$ and $\phi 3$ respond to the fall of signal $\phi 24$ to fall at times t3 and t4, respectively. Transistors Q1 and Q2 are at the ON state since signals $\phi 1$ and $\phi 3$ are respectively at logical high (high level) until the respective times of t3 and t4. Therefore, the pair of bit lines BLa and BLb are equalized (set to Vcc/2) till time t4, and then held at a floating state.

At time t5, word line signal $\phi 7$ rises. Because switching transistor Q5 of memory cell MC1 is turned on in response to signal $\phi 7$ at a high level, a small potential difference appears between bit lines BLa and BLb. After time t6, activation signals $\phi 8$ and $\phi 9$ attain a high level and a low level, respectively, to activate sense amplifier circuit 7. Therefore, the small potential difference between bit lines BLa and BLb is amplified by sense amplifier circuit 7. The rise of transfer signal $\phi 10$ at time t7 causes transistors Q11 and Q12 to be turned on, whereby the potential difference between bit lines BLa and BLb (i.e. the read out data signal) is provided to latch circuit 4 via transistors Q11 and Q12. Latch circuit 4 latches the applied data signals $\phi 21$ and $\overline{\phi 21}$.

Although the reading operation is described for one memory cell column in the above description, a similar reading operation is carried simultaneously for the other memory columns in memory cell array 1. The data signals read out from each memory cell column are held in the corresponding latch circuit, i.e. in data register 4. The data signals held in data register 4 are serially provided to a serial bus line pair SBai and SBbi in response to a serial selecting signal (for example $\phi 14$) applied from serial selector 5.

Figure 7:
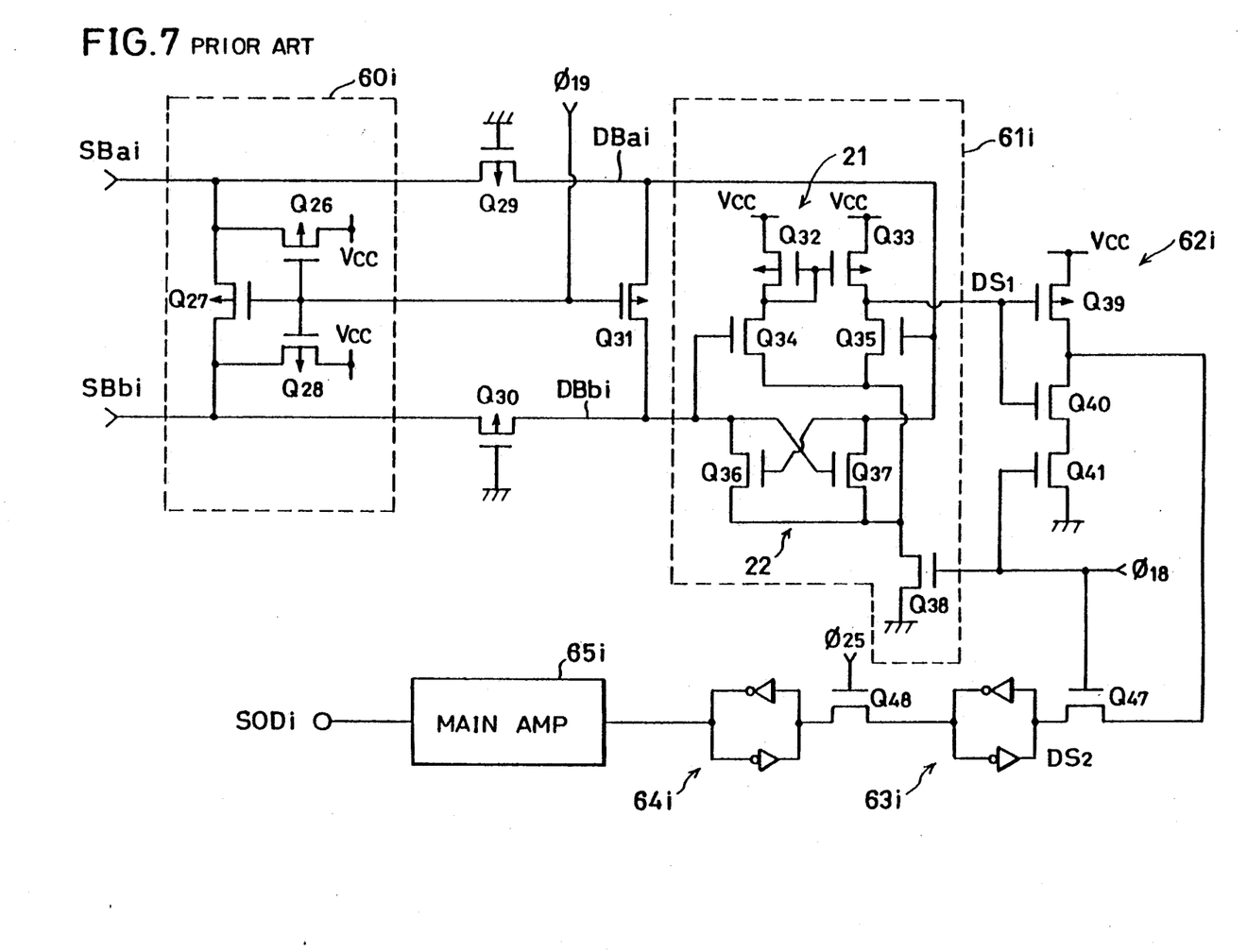
FIG. 7 is a circuit diagram of an output buffer circuit of FIG. 4.

FIG. 7 is a circuit diagram of output buffer 6 of FIG. 4. The field memory of FIG. 4 comprises six serial output data terminals SOD1–SOD6. This means that serial bus SB provided between data register 4 and output buffer 6 comprises six serial bus line pairs. The circuit of FIG. 7 is shown connected to one of the serial bus line pairs, i.e. the i-th serial bus line pairs SBai, SBbi. Serial bus lines SBai and SBbi of FIG. 7 are connected to serial bus lines SBai and SBbi of FIG. 5, respectively.

Referring to FIG. 7, output buffer 6 comprises an equalize circuit 60i for equalizing the serial bus line pair SBai, SBbi, a preamplifier circuit 61i, an inverter circuit 62i, two latch circuits 63i and 64i, and a main amplifier 65i. The output of main amplifier 65i is connected to the i-th serial output data terminal SODi.

Equalize circuit 60i comprises three PMOS transistors Q26, Q27 and Q28 operated in response to equalize signal $\phi 19$. PMOS transistors Q29 and Q30 are connected between serial bus lines SBai and SBbi and the corresponding data bus lines of DBai and DBbi. Transistors Q29 and Q39 have their gates grounded. A PMOS transistor Q31 for equalization is connected between data bus lines BDai and DBbi. Transistor Q31 is operated also in response to equalize control signal $\phi 19$.

Preamplifier 61i comprises a current mirror type amplifier 21 and a cross coupled type amplifier 22 each connected to data bus line pair DBai, DBbi. Current mirror type amplifier 21 is formed of PMOS transistors Q32 and Q33, and NMOS transistors Q34 and Q35. Cross coupled type amplifier 22 is formed of NMOS transistors Q36 and Q37. Amplifiers 21 and 22 are activated in response to preamplifier enable signal $\phi 18$.

Inverter circuit 62i comprises a PMOS transistor Q39 and NMOS transistors Q40 and Q41 connected in series between power supply potential Vcc and ground potential. Transistors Q39 and Q40 have their gates connected to receive data signal DS1 provided from preamplifier 61i. Inverter circuit 62i is activated also in response to enable signal $\phi 18$. NMOS transistors Q47 and Q48 serving as transfer gates are provided in the preceding stages of latch circuits 63i and 64i, respectively. Transistor Q47 is turned on in response to signal φ18. Transistor Q48 is turned on in response to signal φ25.

Figure 8:
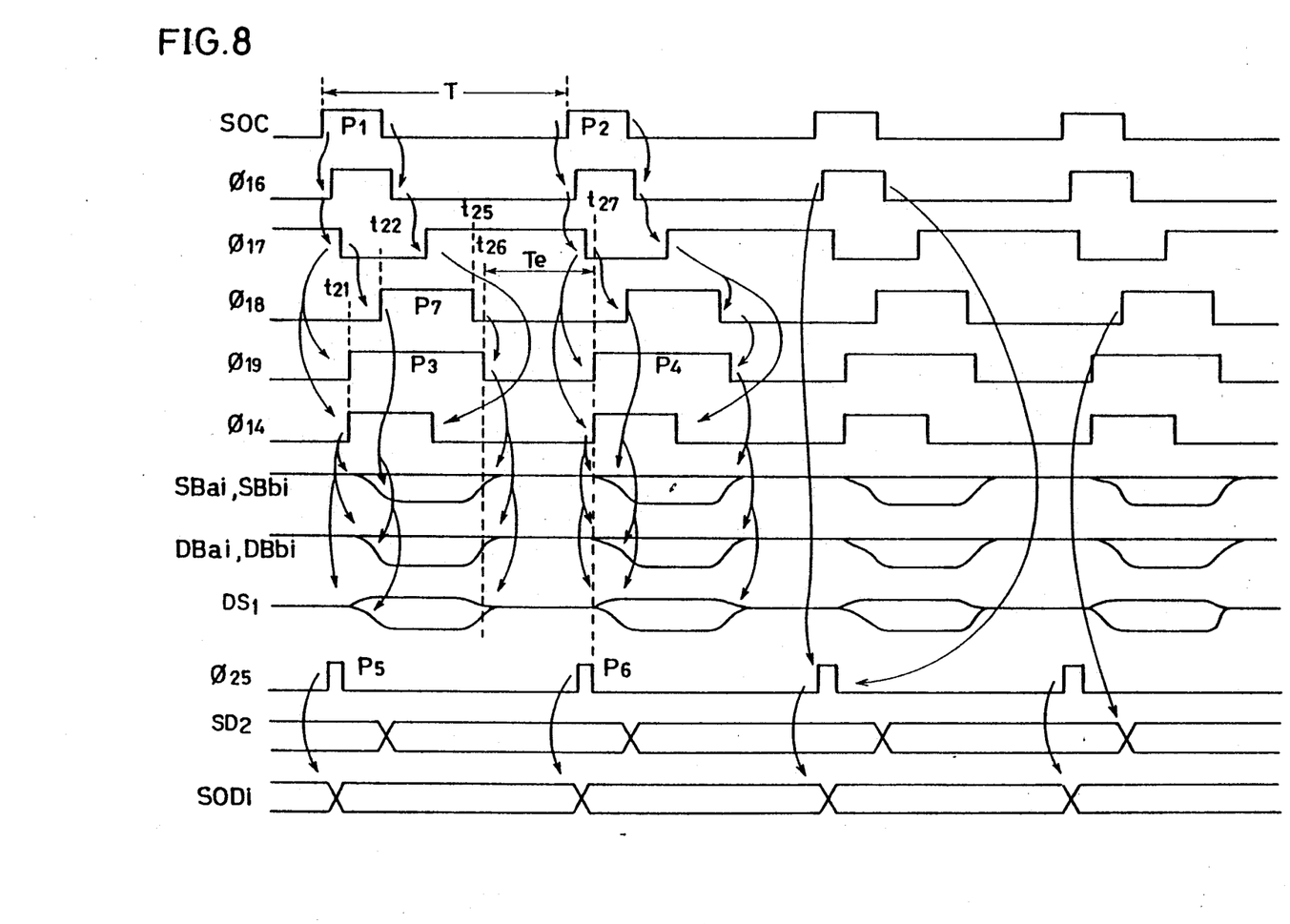
FIG. 8 is a timing chart for explaining the operation of the circuits of FIG. 7.

FIG. 8 is a timing chart for explaining the operation of the circuit of FIG. 7. Referring to FIGS. 7 and 8, the operation thereof will be explained hereinafter. Referring to FIG. 8, one stored data signal is read from one memory cell column during one cycle period of a serial out clock signal SOC. It is understood that six data signals are provided simultaneously within one cycle period via serial output data terminals SOD1-SOD6 of the field memory of FIG. 4. In response to serial out clock signal SOC, clock signal φ16 is generated. In response to clock signal φ16, signal φ17 is generated. In response to signal φ17, signals φ14, φ18 and φ19 are generated.

Since equalize signal φ19 is at a low level before time t21, transistors Q26, Q27 and Q28 forming equalize circuit 60i are at the ON state. Serial bus lines SBai, SBbi are equalized and set to power supply potential Vcc. At time t21, serial selecting signal φ14 and equalize signal φ19 rise. Transistors Q19 and Q20 of FIG. 5 turned on in response to serial selecting signal φ14 of a high level causes a small potential difference between serial bus lines SBai and SBbi. This small potential difference is transmitted to data bus lines DBai and DBbi via transistors Q29 and Q30 of FIG. 7. Transistors Q29 and Q30 are provided for the purpose of increasing the speed of amplification operation of preamplifier 61i.

At time t22, preamplifier enable signal φ18 rises. Therefore, current mirror type amplifier 21 and cross coupled type amplifier 22 provided in preamplifier 61i and inverter circuit 62i are activated. This causes the small potential difference on data bus line pair DBai, DBbi to be amplified, whereby the amplified data signal DS1 is provided to inverter circuit 62i.

Data signal DS1 is inverted by inverter circuit 62i to be provided to main amplifier 65i via two latch circuits 63i and 64i. The data signal latched by latch circuit 63i is shown in FIG. 8 as signal DS2. The data signal applied to main amplifier 65i is amplified therein to be provided to an external source via serial out data terminal SODi.

Figure 9A:
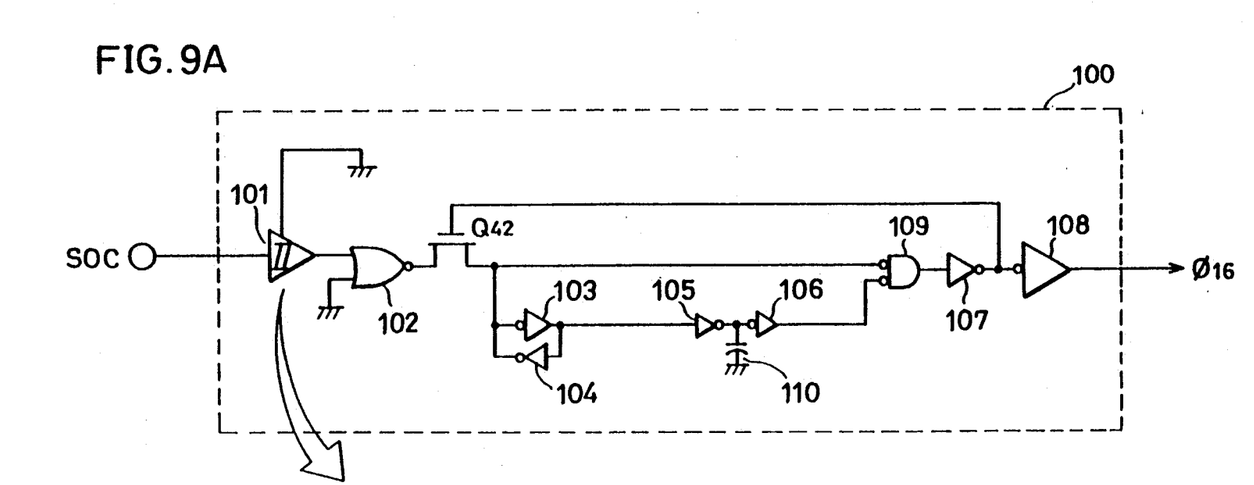
FIGS. 9A and 9B are circuit diagrams of a control circuit provided in the timing signal generating circuit of FIG. 4.
Figure 9B:
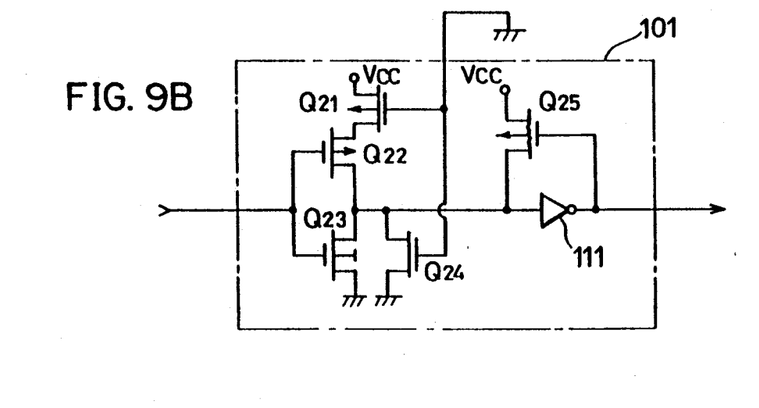
Figure 10:
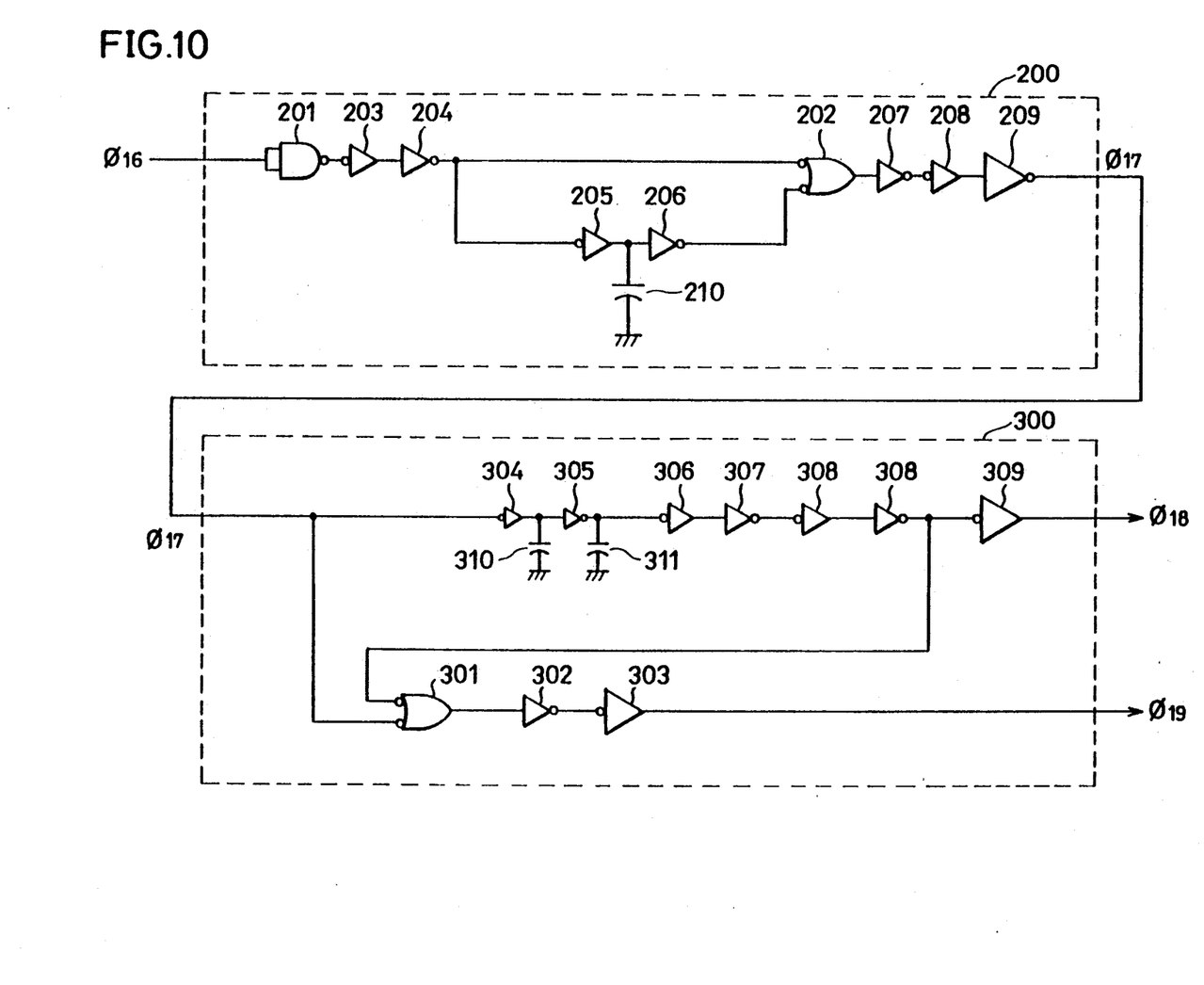
FIG. 10 is a circuit diagram of a control circuit provided in the timing signal generating circuit of FIG. 4.
Figure 11:
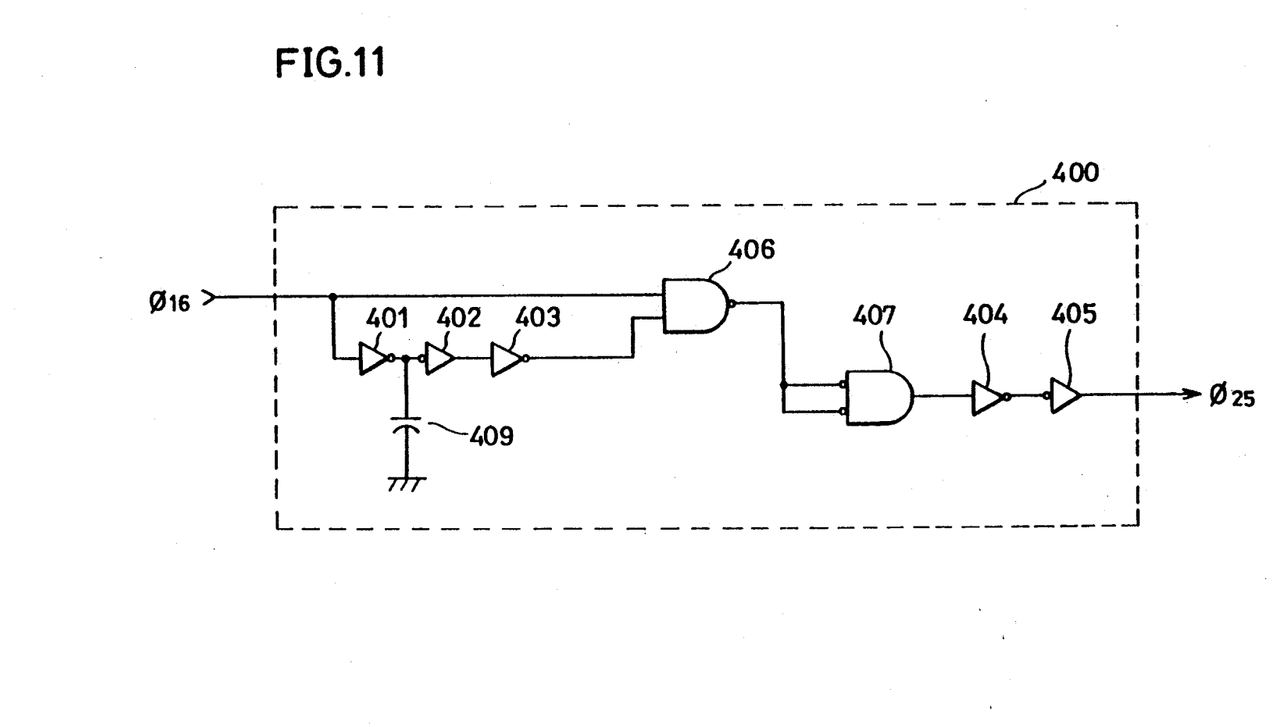
FIG. 11 is a circuit diagram of a control circuit provided in the timing signal generating circuit of FIG. 4.

The circuits for generating various clock signals or control signals used to control the above described operations will be explained hereinafter briefly. FIGS. 9-11 are circuit diagrams of control circuits 100, 200, 300 and 400 for generating clock signals φ16, φ17, φ18, φ19 and φ25. These control circuits 100, 200, 300 and 400 are provided in timing signal generating circuit 17 of FIG. 4.

Referring to FIGS. 9A and 9B, control circuit 100 comprises an input buffer 101 formed by a Schmitt circuit, an NOR gate 102, inverters 103-108, an NOR gate 109, and an NMOS transistor Q42. Input buffer 101 comprises PMOS transistors Q21, Q22 and Q25, NMOS transistors Q23 and Q24, and an inverter 111. Input buffer 101 is connected to receive an externally applied serial out clock signal SOC. Control circuit 100 responds to the applied signal SOC to generate a clock signal φ16 having a pulse width determined by a delay circuit formed of inverters 103-104 and a capacitor 110. Since input buffer 101 is implemented by a Schmitt circuit, an output signal having an MOS logic amplitude can be supplied to NOR gate 102, even though the externally applied signal SOC has a TTL amplitude.

Referring to FIG. 10, control circuit 200 comprises NAND gates 201 and 202, inverters 203-209, and a capacitor 210. NAND gate 201 receives clock signal φ16 provided from control circuit 100 of FIG. 9. In response to the applied clock signal φ16, control circuit 200 generates clock signal φ17 having a pulse width determined by a delay circuit formed of inverters 205 and 206, and capacitor 210. Clock signal φ17 is used to generate the aforementioned serial selecting signal φ14, and is also applied to control circuit 300.

Control circuit 300 comprises an NAND circuit 301, inverters 302-309, and capacitors 310 and 311. Control circuit 300 generates preamplifier enable signal φ18 and equalize signal φ19 used to control the circuit of FIG. 7.

Referring to FIG. 11, control circuit 400 comprises inverters 401-405, an NAND gate 406, an NOR gate 407, and a capacitor 409. Control circuit 409 responds to clock signal φ16 provided from circuit 100 of FIG. 9 to generate clock signal φ25 for controlling transfer gate transistor Q48 of FIG. 7.

The frequency of externally applied serial out clock signal SOC is becoming higher to comply with the request of higher operation speed of field memories, as mentioned before. Therefore, the cycle period T of serial out clock signal SOC of FIG. 8 has become shorter, leading to the following problems.

A higher frequency of signal SOC requires a higher frequency of equalize signal φ19 for equalizing serial bus lines SBai and SBbi. This means that the equalize time period Te of FIG. 8 (i.e. the time period of signal φ19 at a low level) becomes shorter. The equalizations of serial bus lines SBai and SBbi, and data bus lines DBai and DBbi may not be carried out sufficiently during this shorter equalize time period Te. Particularly, the long wiring length of serial bus lines SBai and SBbi is responsible for the charging/discharging of equalization requiring a long time period. Erroneous reading will occur if preamplifier 61i commences the next amplifying operation in response to enable signal φ18 in the case where serial bus lines SBai and SBbi are not yet completely equalized. More specifically, the preceding read out data signal remains on serial bus line pair SBai, SBbi because serial bus lines SBai and SBbi are not equalized sufficiently. The newly read out data signal will be affected by the remaining data signal to result in erroneous reading.

SUMMARY OF THE INVENTION

An object of the present invention is to prevent erroneous reading of a semiconductor memory device where a faster reading operation is required.

Another object of the present invention is to prevent erroneous reading in a serial access memory device where a faster reading operation is required.

A semiconductor memory device according to an aspect of the present invention includes a plurality of memory cell columns, a plurality of bit line pairs each connected to a corresponding one of the plurality of memory cell columns, a signal transmission line pair coupled to the plurality of bit line pairs for transmitting a data signal applied from the plurality of bit line pairs, an equalize circuit for equalizing the signal transmission line pair, an amplifying circuit responsive to an externally applied clock signal for amplifying a data signal transmitted via the signal transmission line pair, and a disconnecting circuit for electrically disconnecting the signal transmission line pair from the amplifying circuit after the amplifying operation of the amplifying circuit is commenced. The equalize circuit commences the equalizing operation of the signal transmission line pair after the operation of the disconnecting circuit.

In operation, the amplifying circuit commences the amplification of a data signal transmitted via the signal transmission line pair, followed by the disconnecting circuit electrically disconnecting the signal transmission line pair from the amplifying circuit. The equalize circuit commences the equalizing operation of the signal transmission line pair after the disconnecting circuit electrically disconnects the signal transmission line pair from the amplifying circuit. Therefore, the equalize circuit can commence the equalization of the signal transmission line pair at an earlier timing, without having to wait for the completion of the amplifying operation of the amplifying circuit. As a result, erroneous reading of a semiconductor memory device can be prevented where a faster reading operation is required.

According to another aspect of the present invention, a serial access memory device includes a plurality of memory cell columns, a plurality of bit line pairs each connected to a corresponding one of the plurality of memory cell columns, a plurality of signal holding circuits for holding a data signal read out from the corresponding one memory cell column, a signal transmission line pair for transmitting a data signal applied from the plurality of signal holding circuits, a plurality of serial transfer circuits each transferring the data signal held in a corresponding one of the plurality of signal holding circuits, an equalize circuit for equalizing the signal transmission line pair, an amplifier responsive to a serial out clock signal for amplifying a data signal transmitted via the signal transmission line pair, and a disconnecting circuit for electrically disconnecting the signal transmission line pair from the amplifier after the operation of the amplifier is commenced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
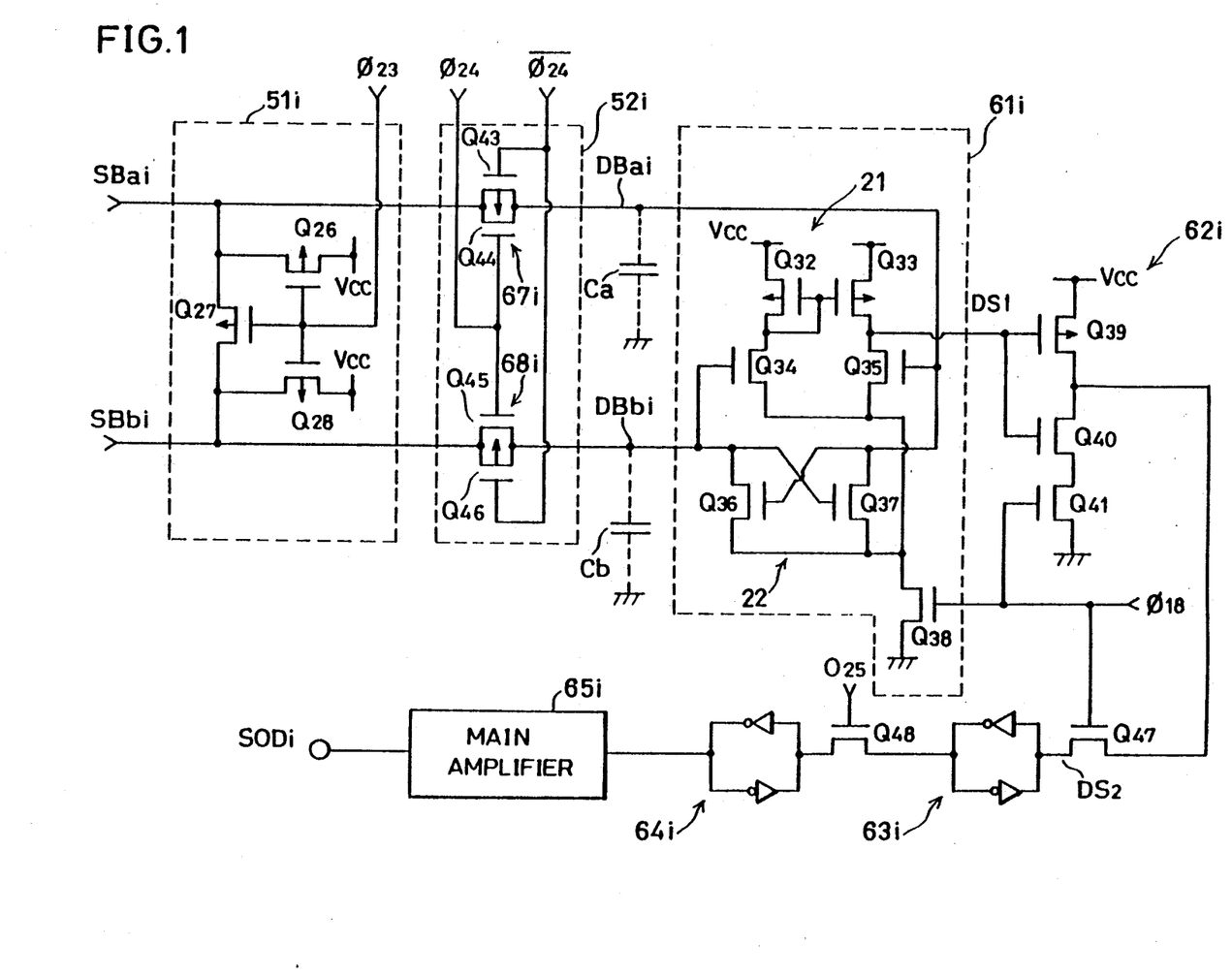
FIG. 1 is a circuit diagram of an output buffer circuit showing an embodiment of the present invention.

The output buffer of FIG. 1 is an improved output buffer 6 of FIG. 4, applied to a field memory. Referring to FIG. 1, the circuit of FIG. 1 differs from the conventional one of FIG. 7 as follows. A disconnecting circuit 52i formed of transmission gates 67i and 68i is provided between serial bus line SBai, SBbi and data bus lines DBai, DBbi. Transmission gate 67i is formed by a PMOS transistor Q43 and an NMOS transistor Q44. Similarly, transmission gate 68i is formed by a PMOS transistor Q46 and an NMOS transistor Q45. Transistors Q44 and Q45 have their gates connected to receive disconnect control signal $\phi 24$. Transistors Q43 and Q46 have their gates connected to receive an inverted disconnect control signal $\overline{\phi 24}$. Disconnection control signal $\phi 24$ and $\overline{\phi 24}$ are generated from a newly provided circuit 500 (described later with reference to FIG. 3) in timing signal generating circuit 17 of FIG. 4. Although equalize circuit 51i is formed by the three PMOS transistors Q26, Q27 and Q28, similar to equalize circuit 60i of FIG. 7, these transistors are operated in response to an improved equalize signal $\phi 23$. This improved equalize signal $\phi 23$ is generated also from a newly provided control circuit 600 (also described later with reference to FIG. 3). The structures of the other circuits excluding the above described circuits are similar to those in FIG. 7, and their descriptions will not be repeated.

Figure 3:
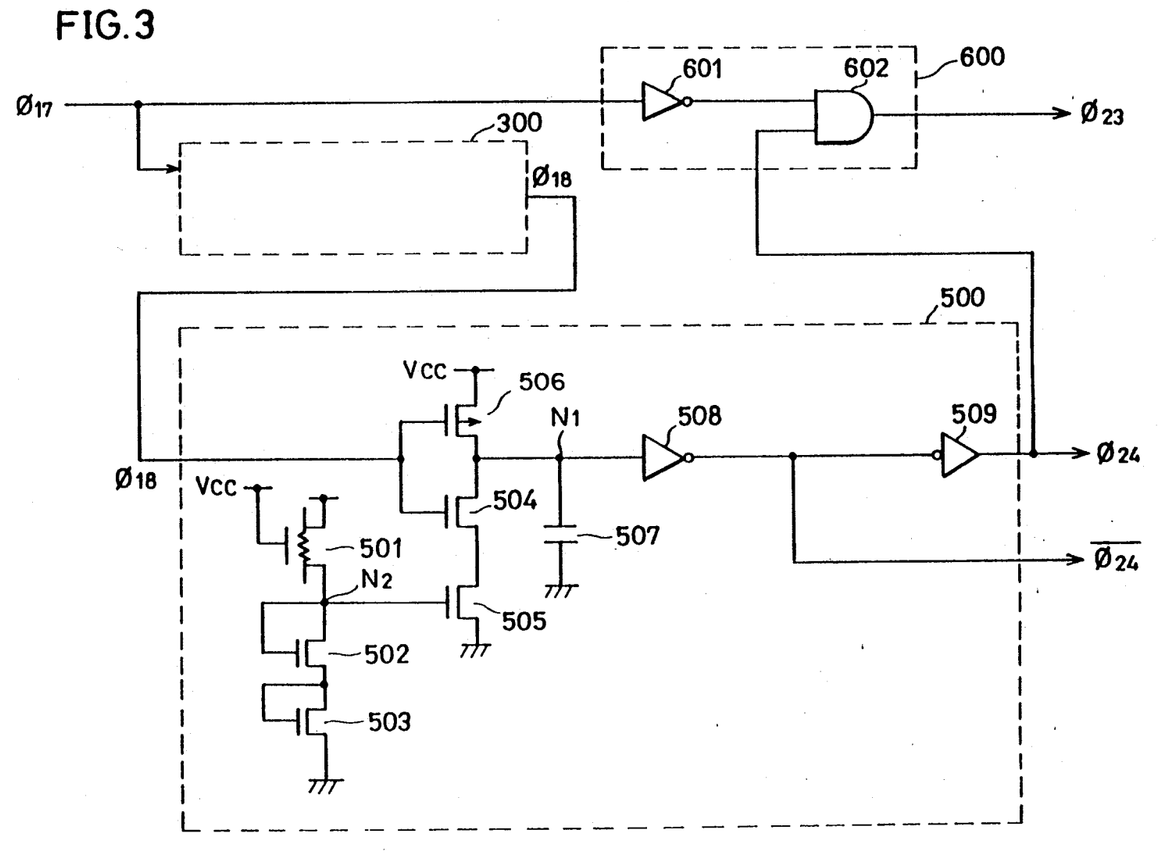
FIG. 3 is a circuit diagram of control circuits newly provided in a timing signal generating circuit of FIG. 4.

FIG. 3 is a circuit diagram of control circuits 500 and 600 newly provided in timing signal generating circuit 17 of FIG. 4. The improved equalize signal $\phi 23$ and disconnection control signals $\phi 24$ and $\overline{\phi 24}$ generated from control circuits 500 and 600 are provided to the circuit of FIG. 1.

Referring to FIG. 3, control circuit 500 comprises NMOS transistors 501-505, a PMOS transistor 506, a capacitor 507, and inverters 508 and 509. NMOS transistor 501 has a high ON resistance, with the gate thereof connected to power supply potential Vcc. Transistor 501 therefore functions as a high resistance. Transistors 504 and 506 have their gates connected to receive preamplifier enable signal $\phi 18$ generated from control circuit 300 of FIG. 10. Transistors 502 and 503 also serve as resistances. Transistor 505 has its gate connected to a common connection node N2 of transistors 501 and 502. Since transistor 501 acts as the high resistance, transistor 505 also has a high ON resistance. A CMOS inverter is implemented with transistors 504 and 506. Capacitor 507 is connected between the output node N1 of this inverter and ground. The charge of capacitor 507, i.e. the positive charge at node N1 is discharged towards ground via transistor 505 having a high ON resistance. Expressing R as the on resistance value of transistor 505, and C as the capacitance of capacitor 507, the time required to discharge the positive charge in node N1 is defined by time constant RC. In other words, the discharge of positive charge of node N1 occurring when preamplifier enable signal rises is delayed according to the defined time constant RC. The charge of capacitor 507, i.e. the positive charge of node N1, is carried out rapidly via transistor 506, so that the potential at node N1 quickly rises. This means that disconnection control signal $\overline{\phi 24}$ rises with a delay defined by RC when preamplifier enable signal $\phi 18$ rises. When preamplifier enable signal $\phi 18$ falls, signal $\phi 24$ also falls with almost no delay.

Control circuit 600 comprises an inverter 601 and an AND gate 602. Inverter 601 receives a clock signal $\phi17$ generated from control circuit 200 of FIG. 10. AND gate 602 receives the output signal of inverter 601 and signal $\phi24$ provided from control circuit 500. Control circuit 600 generates an equalize signal $\phi23$ improved via AND gate 602.

Figure 2:
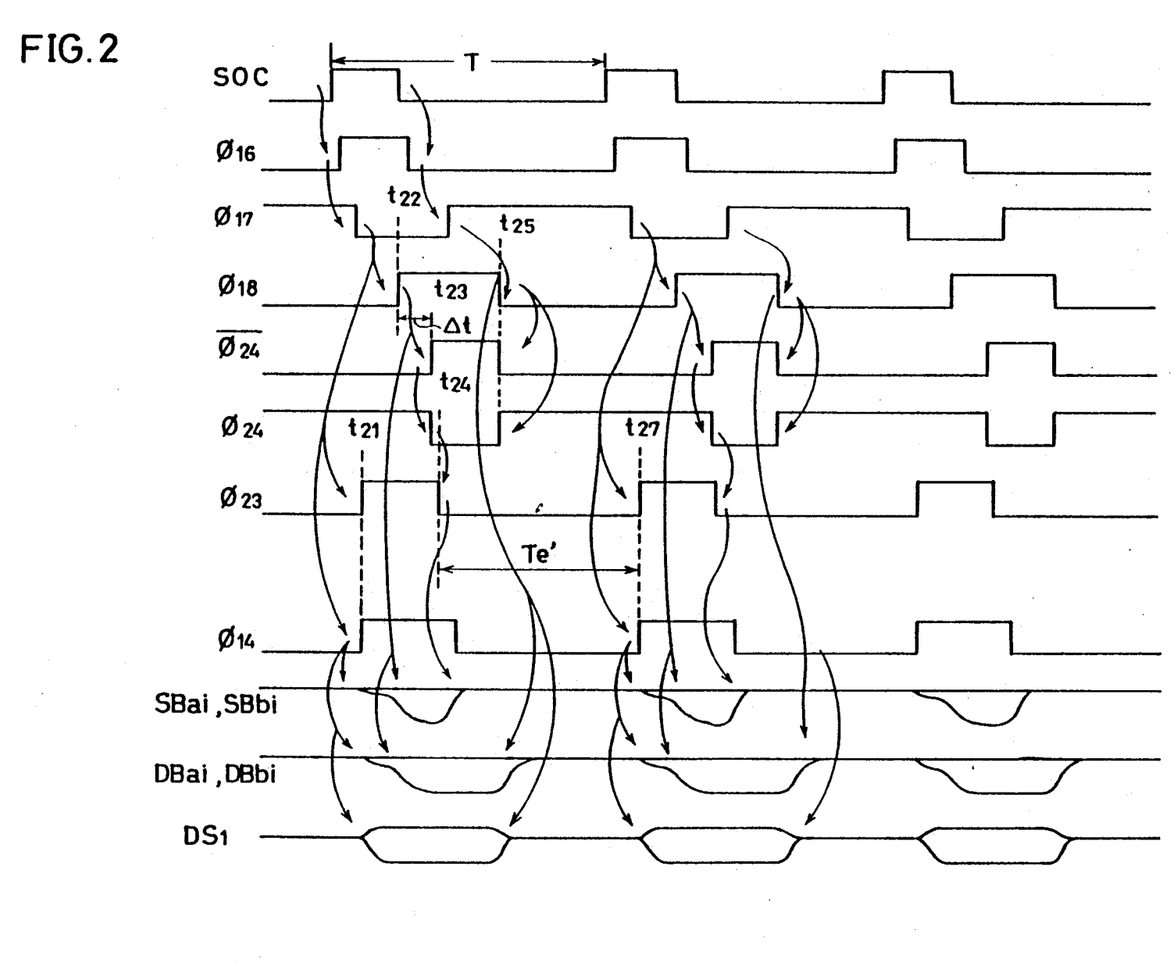
FIG. 2 is a timing chart for explaining the operation of the circuit of FIG. 1.

FIG. 2 is a timing chart for explaining the operation of the circuit of FIG. 1. The operation of the improved output buffer circuit of FIG. 1 will be explained hereinafter with reference to FIGS. 1 and 2.

Control circuit 100 of FIG. 9 responds to serial out clock signal SOC to generate a clock signal $\phi16$. Control circuits 200 and 300 of FIG. 10 respond to clock signal $\phi16$ to generate clock signals $\phi17$, $\phi18$ and $\phi19$.

At time t21, serial selecting signal $\phi14$ and improved equalize signal $\phi23$ rise. Since transistors Q19 and Q20 of FIG. 5 are turned on in response to the rise of signal $\phi14$, data latched in a latch circuit formed by transistors Q13 and Q16 is provided to serial bus line pair Sbai, SBbi. Until time t21, equalize circuit 51i equalizes serial bus lines SBai and SBbi since signal $\phi23$ of a low level is provided. The equalization is completed subsequent to time t21, and serial bus lines SBai and SBbi are held at a floating state. A small potential difference according to a read out data signal appears between serial bus lines SBai and SBbi after time t21. At this time, transmission gate 67i and 68i are at the on state since disconnection control signal $\phi24$ and $\overline{\phi24}$ are at a high level and a low level, respectively. The small potential difference between serial bus lines SBai and SBbi is transmitted to data bus lines DBai and DBbi.

At time t22, the preamplifier enable signal rises, whereby preamplifier 61i is activated. Preamplifier 61i starts to amplify the small potential difference transmitted via transmission gates 67i and 68i.

After a predetermined time $\Delta t$ has elapsed from time t22, disconnection control signal $\phi24$ and $\overline{\phi24}$ attain a low level and a high level, respectively at time t23. Accordingly, transmission gates 67i and 68i are turned off in response to signals $\phi24$ and $\overline{\phi24}$. As a result, the connections between serial bus lines SBai, SBbi and data CDai, CDbi are electrically disconnected.

Right after time t23 at time t24, improved equalized signal $\phi23$ falls. Transistors Q26, Q27 and Q28 in equalized circuit 51i are turned on, whereby the equalization of serial bus lines SBai and SBbi is restarted. This equalization is continued until equalize signal $\phi23$ rises at time t27.

At time t25, preamplifier equalize signal $\phi18$ falls. Substantially at the same time, disconnection control signals $\phi24$ and $\overline{\phi24}$ attain a high level and a low level, respectively. Preamplifier 61i response to the fall of signal $\phi18$ to terminate the amplifying operation. Transmission gates 67i and 68i are turned on in response to signal $\phi24$ of a high level and signal $\overline{\phi24}$ of a low level. Therefore, equalize circuit 51i starts to equalize data bus lines DBai and DBbi. Data signal DS1 amplified by preamplifier 61i is provided to and latched in latch circuit 63i via inverter circuit 62i and transistor Q47 until the time of t25.

It can be seen from FIG. 2 that the equalization time period Te' of serial bus lines SBai and SBbi begins at time t24 and ends at time t27. A conventional output buffer circuit has an equalization time period Te starting at time t26 and ending at time t27, as shown in FIG. 8. By comparing FIGS. 2 and 8, it can be understood that the output buffer circuit of FIG. 1 has a starting time (t24) of equalization of serial bus lines SBai and SBbi earlier than the starting time (t26) of a conventional one. The output buffer circuit of FIG. 1 is provided with a disconnecting circuit 52i comprising transmission gates 67i and 68i to allow equalize circuit 51i to commence equalizing operation right after the operation of circuit 52i. This earlier starting time of equalizing operation ensures a sufficient equalization time period Te' even if cycle period T of serial out clock signal SOC becomes shorter. In other words, a newly read out data signal is not affected by a preceding read out data signal because equalization of serial bus line pair SBai and SBbi can be carried out sufficiently even at the time of a faster serial reading operation. Thus, erroneous read out is prevented.

In the preferred embodiment, capacitors Ca and Cb are connected between data bus line DBai and ground, and DBbi and ground, respectively, as shown by the dotted lines in FIG. 1. Capacitors Ca and Cb have the same capacitance value, in which the value is determined from the standpoint of holding a data signal and the required high speed operation. Capacitors Ca and Cb hold the charge of a data signal transmitted via transmission gates 67i and 68i during the time period from t22 to t23. Although the predetermined time length $\Delta t$ is set to be a very short time period where high speed operation is required, the amplifying operation of preamplifier 61i is carried out stably by the holding effect of the signal charges of capacitors Ca and Cb.

The predetermined time length $\Delta t$ is set so that preamplifier 61i amplifies a data signal properly. Preamplifier 61i is activated at time t22 by the rise of preamplifier enable signal $\phi18$. At time t23, disconnecting circuit 52i disconnects serial bus lines SBai and SBbi from data bus lines DBai and DBbi since disconnection control signals $\phi24$ and $\overline{\phi24}$ attain a low level and a high level, respectively. Therefore, preamplifier 61i must start a normal amplification of a data signal during the time period of time t22 to t23, i.e. during time length $\Delta t$. Time length $\Delta t$ is set to a value that can ensure normal amplifying operation by preamplifier 61i.

Although the embodiment is described in which the present invention is applied to a serial access memory, the present invention can be generally applied to semiconductor memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cell columns;
   a plurality of bit line pairs, each connected to a corresponding one of said plurality of memory cell columns;
   a signal transmission line pair coupled to said plurality of bit line pairs for transmitting a data signal applied from said plurality of bit line pairs;
   equalize means connected to said signal transmission line pair for equalizing said signal transmission line pair;
   amplifying means, responsive an activation signal, for amplifying the data signal transmitted via said signal transmission line pair, said activation signal being generated in response to an externally applied clock signal and having a first level activating an amplifying operation and a second level deactivating said amplifying operation; and disconnecting means for electrically disconnecting said signal transmission line pair from said amplifying means after said amplifying means receives said activation signal at said first level and before said activation signal changes to said second level; wherein said equalize means commences equalizing operation of said signal transmission line pair after said disconnecting means electrically disconnects said transmission line pair from said amplifying means and before said activation signal changes to said second level.

2. The semiconductor memory device according to claim 1, wherein said equalize means is responsive to the first level of said activation signal to commence an equalizing operation after a predetermined time length has elapsed since activating said amplifying operation by said amplifying means in response to said the first level of said activation signal.

3. The semiconductor memory device according to claim 2, further comprising:

disconnection control signal generating means responsive to said activation signal for generating a disconnection control signal to control said disconnecting means, said disconnecting means being operated in response to the disconnection control signal generated from said disconnection control signal generating means.

4. The semiconductor memory device according to claim 3, wherein said disconnection control signal generating means comprises rising edge delay means for receiving said activation signal at said first level, and for delaying the rising edge of said activation signal by said predetermined time length to provide the delayed signal as said disconnection control signal, said disconnecting means comprises switching means connected between said signal transmission line pair and said amplifying means, operating in response to the disconnection control signal provided from said rising edge delay means.

5. The semiconductor memory device according to claim 1, further comprising charge holding means connected to an input node of said amplifying means for holding a charge corresponding to said data signal transmitted via said signal transmission line pair.

6. The semiconductor memory device according to claim 5, wherein said charge holding means comprises capacitor means connected between said input node of said amplifying means and a predetermined potential.

7. The semiconductor memory device according to claim 1, said semiconductor memory device comprising a serial access memory device, said externally applied clock signal comprising a serial out clock signal.

8. The semiconductor memory device according to claim 1, wherein said amplifying means comprises a current mirror type amplifier operated in response to the activation signal.

9. The semiconductor memory device according to claim 8, wherein said amplifying means further comprises a cross coupled type amplifier formed by two NMOS transistors, said cross coupled type amplifier is operated in response to the activation signal.

10. A serial access memory device responsive to an externally applied serial out clock signal for providing in series a stored data signal, comprising:

a plurality of memory cell columns, a plurality of bit line pairs, each connected to a corresponding one of said plurality of memory cell columns, a plurality of signal holding means, each connected to a corresponding one of said plurality of bit line pairs, for holding a data signal read out from said corresponding one memory cell column, a signal transmission line pair for transmitting a data signal provided from said plurality of signal holding means, a plurality of serial transfer means, each connected between said plurality of signal holding means and said signal transmission line pair, for transferring a data signal held in a corresponding one of said plurality of signal holding means to said signal transmission line pair, serial selecting means responsive to the serial out clock signal for selecting in series said plurality of serial transfer means, said plurality of serial transfer means responsive to said serial selecting means for transferring in series a data signal held by said plurality of signal holding means to said signal transmission line pair, equalize means connected to said signal transmission line pair for equalizing said signal transmission line pair, amplifying means responsive to the serial out clock signal for amplifying said data signal transmitted via said signal transmission line pair, and disconnecting means for electrically disconnecting said signal transmission line pair and said amplifying means after said amplifying means commences amplifying operation, said equalized means commencing equalized operation of said signal transmission line pair after said disconnecting means is operated.

11. The serial access memory device according to claim 10, wherein said plurality of signal holding means comprises a plurality of latch circuit means, each connected to said plurality of bit line pairs, for latching a data signal read out from said corresponding one memory cell column.

12. The serial access memory device according to claim 11, wherein said signal transmission line pair comprises a serial bus line pair for transmitting a data signal transferred in series from said plurality of serial transfer means.

* * * * *